(12) United States Patent
Kondo

(10) Patent No.: US 7,109,534 B2
(45) Date of Patent: Sep. 19, 2006

(54) TRANSISTOR AND ELECTRONIC DEVICE

(75) Inventor: Takayuki Kondo, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/804,060

(22) Filed: Mar. 19, 2004

(65) Prior Publication Data
US 2004/0253782 A1    Dec. 16, 2004

(30) Foreign Application Priority Data
Apr. 1, 2003    (JP) ............... 2003-097972

(51) Int. Cl.
*H01L 29/70* (2006.01)
*H01L 29/739* (2006.01)
(52) U.S. Cl. ..................... 257/197; 257/584
(58) Field of Classification Search ............ 257/19, 257/47, 85, 183, 189, 197, 584; 438/235, 438/309, 452
See application file for complete search history.

(56) References Cited

U.S. PATENT DOCUMENTS

| | | | |
|---|---|---|---|
| 2,569,347 A * | 9/1951 | Shockley | 330/309 |
| 3,590,479 A * | 7/1971 | Devries | 438/355 |
| 5,318,916 A | 6/1994 | Enquist et al. | |
| 5,378,922 A * | 1/1995 | Sovero | 257/582 |
| 5,583,059 A * | 12/1996 | Burghartz | 438/319 |
| 2002/0155670 A1 * | 10/2002 | Malik | 438/312 |
| 2003/0011000 A1 * | 1/2003 | Watanabe et al. | 257/197 |
| 2003/0160266 A1 * | 8/2003 | Yanagisawa | 257/197 |
| 2003/0170946 A1 * | 9/2003 | Kondo | 438/200 |
| 2004/0007709 A1 * | 1/2004 | Kondo | 257/80 |
| 2004/0036078 A1 * | 2/2004 | Kondo | 257/80 |
| 2005/0040387 A1 * | 2/2005 | Feng et al. | 257/14 |
| 2005/0040432 A1 * | 2/2005 | Feng et al. | 257/198 |

FOREIGN PATENT DOCUMENTS

| | | |
|---|---|---|
| JP | 06-326330 A | 11/1994 |
| JP | 09-186240 A | 7/1997 |
| JP | 2003-197881 | 7/2003 |

* cited by examiner

*Primary Examiner*—Lex H. Malsawma
(74) *Attorney, Agent, or Firm*—Oliff & Berridge, PLC

(57) ABSTRACT

The invention provides a transistor capable of achieving a higher speed although its construction is easy to manufacture without requiring wiring to intersect three-dimensionally even if unit elements of transistors are connected in parallel, and to provide an electronic device. The transistor can include common collector wiring provided on an insulating substrate, a first layer, which is provided on the common collector wiring which is made of an N-type semiconductor, a second layer, made of a P-type semiconductor, provided on the first layer low, a third layer, which is provided on the second layer and which is made of an N-type semiconductor, common base wiring, which is provided on the insulating substrate and which is connected to the second layer, and common emitter wiring, which is provided on the insulating substrate and which is connected to the third layer.

18 Claims, 14 Drawing Sheets

TRANSISTOR AND ELECTRONIC DEVICE

BACKGROUND OF THE INVENTION

1. Field of Invention

The present invention relates to a transistor and an electronic device.

2. Description of Related Art

A hetero-bipolar transistor (HBT), which is a device capable of amplifying a high-frequency signal on the order of Gigahertz, has a construction in which a collector layer, a base layer, and an emitter layer are layered in sequence on a semi-insulating semiconductor substrate. When the shape of this hetero-bipolar transistor (unit element) is increased, the output increases, but performance, such as operating speed, decreases. Therefore, usually, in order to form an amplification circuit capable of high speed and a large output, a plurality of hetero-bipolar transistors (unit elements) are formed on a substrate, and the plurality of the unit elements are connected in parallel, forming one amplification circuit as a whole. See, for example, Japanese Unexamined Patent Application Publication No. 6-326330.

However, since the hetero-bipolar transistor is a three-terminal device, if, by using wiring, attempts are made to connect in parallel terminals of a plurality of unit elements provided on the top surface of a substrate, a three-dimensional intersection occurs in the wiring in the conventional case. Since the intersection of this wiring act as a capacitance, which causes the characteristics to be deteriorated, complicated manufacturing measures, such as making the intersection by providing an air gap (air bridge), are necessary.

In order to avoid this situation, there is a method in which collector layers in all the unit elements are made continuous, and a common collector electrode is provided at only one place. However, in this method, since the resistance of the collector layers cannot be decreased sufficiently, it is difficult to realize a high-performance hetero-bipolar transistor.

SUMMARY OF THE INVENTION

The present invention has been made in view of the above-described circumstances. An object of the present invention is to provide a transistor capable of operating at a higher speed although its construction is easy to manufacture, without requiring wiring to intersect three-dimensionally even if unit elements are connected in parallel, and to provide an electronic device.

To achieve the above-mentioned object, the transistor of the present invention can include an insulating substrate, a first metal film provided on the insulating substrate, a first layer, which is arranged on the first metal film and which is made of an N-type semiconductor, a second layer, which is provided on the first layer and which is made of a P-type semiconductor, a third layer, which is provided on the second layer and which is made of an N-type semiconductor, a second metal film, which is provided on the insulating substrate in such a manner as not to be brought into contact with the first metal film but which is brought into contact with the second layer, and a third metal film which is provided on the insulating substrate in such a manner as not to be brought into contact with the first metal film and the second metal film but which is brought into contact with the third layer.

According to the invention, a bipolar transistor in which the first layer serves as a collector, the second layer serves as a base, and the third layer serves as an emitter can be formed. Here, since the first layer, which is a collector, is directly formed on the first metal film provided on the insulating substrate, heat dissipation characteristics are improved compared to a case where a collector layer is directly formed on the insulating substrate, as in a conventional structure, the reliability is improved, and the driving power can be easily increased. Thus, a compact transistor capable of high-speed operation can be easily formed.

Furthermore, in the transistor of the present invention, preferably, the first layer functions as a collector, the second layer functions as a base, and the third layer functions as an emitter. According to the present invention, for example, by inputting an electrical signal to the second metal film with the first metal film at a grounding potential, and by applying a bias voltage to the third metal film via a resistor, etc., a high-gain amplification circuit capable of amplifying a high-frequency signal can be formed.

In the transistor of the present invention, preferably, the first metal film functions as collector wiring, the second metal film functions as base wiring, and the third metal film functions as emitter wiring. According to the present invention, for example, the first metal film can be made to function as a collector electrode and collector wiring connected to the collector electrode, the second metal film can be made to function as a base electrode and base wiring connected to the base electrode, and the third metal film can be made to function as an emitter electrode and emitter wiring connected to the emitter electrode. As a result, it is possible to easily form a compact transistor having good heat dissipation characteristics and high reliability, capable of easily achieving large driving power, and capable of high-speed operation.

In the transistor of the present invention, preferably, the second layer can be formed on the entire top surface of the first layer, and the third layer is formed on a part of the area of the top surface of the second layer. According to the present invention, since the second layer is formed on the entire top surface of the first layer, whereas the second metal film is directly formed on the insulating substrate, the second metal film can be connected to the second layer without being brought into contact with the first metal film and the first layer and without intersecting the first metal film and the first layer. Therefore, according to the present invention, since air-gap wiring for allowing wiring to intersect one another is not necessary, the wiring capacitance can be reduced, and the transistor can be manufactured simply and easily.

In the transistor of the present invention, preferably, the first layer and the second layer can each be formed in a rectangular plate shape, and the third layer is formed in a rectangular shape, which is longer and narrower than that of the first layer and the second layer. According to the present invention, by forming the first layer, the second layer, and the third layer to be in a rectangular shape, a high-performance transistor for which wiring is easy can be formed.

In the transistor of the present invention, preferably, the first layer, the second layer, and the third layer are formed so as to cross on the top surface of the first metal film. According to the present invention, for example, when a plurality of NPN structures formed of the first layer, the second layer, and the third layer are provided on one first metal film, the second metal film to which the electrode (base electrode) of each second layer is connected can be provided on one side of the first metal film, and the third metal film to which the electrode (emitter electrode) of each third layer is connected can be provided on the other side of the second metal film. Therefore, when a plurality of NPN structures are formed on one first metal film, whereas the first metal film, the second metal film, and the third metal film are directly formed on the insulating substrate, the second metal film can be connected to each second layer, and the third metal film can be connected to each third layer in such a manner that those metal films do not contact each other and do not intersect each other.

In the transistor of the present invention, preferably, the first layer, the second layer, and the third layer can be formed of layers that are formed as tile-shaped elements, which are very small tile-shaped semiconductor elements. According to the present invention, by forming the first layer, the second layer, and the third layer by tile-shaped elements, the first layer, the second layer, and the third layer can be simply and easily provided at desired positions on the first metal film, and the flexibility of arrangement and the ease of changing the arrangement can be improved. Furthermore, according to the present invention, the first layer, the second layer, and the third layer can be formed individually in advance as the tile-shaped elements, and the first layer, the second layer, and the third layer can be individually checked and selected. Thus, a high-quality transistor can be easily provided.

In the transistor of the present invention, preferably, the tile-shaped elements can be such that a collector electrode is formed on the bottom surface of the first layer, a base electrode is formed in an area other than the area where the third layer is provided on the top surface of the second layer, and an emitter electrode is formed on the top surface of the third layer, and the collector electrode in the tile-shaped elements is joined to the first metal film, the base electrode is joined to the second metal film, and the emitter electrode is joined to the third metal film.

According to the present invention, the tile-shaped elements can be simply and easily joined at desired positions on the first metal film, the second layer can be simply and easily joined to the second metal film, and the third layer can be simply and easily joined to the third metal film. Thus, a high-quality transistor can be easily provided.

In the transistor of the present invention, preferably, the tile-shaped elements are joined to the first metal film on the insulating substrate, the first layer of the tile-shaped elements being the joining surface.

The transistor of the present invention is preferably formed of a transistor that functions as a hetero-bipolar transistor. According to the present invention, for example, by making the band gap of the first layer different from the band gap of the third layer, a hetero-bipolar transistor can be formed. Thus, according to the present invention, an amplification circuit capable of amplifying a high-frequency signal used in wireless communication at a high gain can be simply and easily provided.

In the transistor of the present invention, preferably, the first layer is an N-type semiconductor made of gallium and arsenic, the second layer is a P-type semiconductor made of gallium and arsenic, and the third layer is an N-type semiconductor made of aluminum, gallium, and arsenic. According to the present invention, a hetero-bipolar transistor can be simply and easily formed. Furthermore, according to the present invention, a plurality of unit elements, which form hetero-bipolar transistors, are arranged on one first metal film, and the plurality of unit elements can be connected in parallel in such a manner that a three-dimensional intersection of the plurality of unit elements does not occur. Thus, according to the present invention, it is possible to easily provide a hetero-bipolar transistor which is capable of achieving a larger output and which operates at a higher speed than conventionally.

In the transistor of the present invention, preferably, a plurality of the first layers are provided on the one first metal film, and the second layer and the third layer are provided for each of the first layers. According to the present invention, a plurality of hetero-bipolar transistors can be formed by using one first metal film as a common collector electrode and wiring. Thus, according to the present invention, the characteristics of hetero-bipolar transistors can be matched with high precision.

In the transistor of the present invention, preferably, a plurality of the second layers are interconnected with one another by the one second metal film, and a plurality of the third layers are interconnected with one another by the one third metal film. According to the present invention, by using one first metal film as common collector wiring, by using one second metal film as common base wiring, and by using one third metal film as common emitter wiring, a plurality of hetero-bipolar transistors (unit elements) can be connected in parallel. Here, since the first metal film, the second metal film, and the third metal film by which unit elements are connected in parallel are each directly formed on the insulating substrate, there is no three-dimensional intersection of the wiring. Thus, according to the present invention, a hetero-bipolar transistor which is capable of achieving a large output and which operates at a higher speed than conventionally can be provided.

Furthermore, according to the present invention, for example, by making a portion connected to the electrode of each unit element in each of the first metal film, the second metal film, and the third metal film be the same shape for each unit element, the wiring shape of each unit element can be made the same. Thus, according to the present invention, it can be possible to provide a hetero-bipolar transistor in which unit elements whose characteristics are matched with one another are connected in parallel.

Furthermore, according to the present invention, since the first metal film, the second metal film, and the third metal film formed on the insulating substrate are directly connected to the electrode of each unit element, there is no need to provide a via hole for adjusting the wiring length to each electrode of each unit element, and a high-performance hetero-bipolar transistor can be provided at low cost through simple and easy manufacturing steps.

In the transistor of the present invention, preferably, the first metal film, the second metal film, and the third metal film do not intersect one another. According to the present invention, since the first metal film, the second metal film, and the third metal film do not intersect or cross over one another, the wiring capacitance can be reduced, and a high-performance transistor which can be manufactured easily can be provided.

In the transistor of the present invention, preferably, the portion of the second metal film that is not connected to the second layer in the second metal film is directly provided on the insulating substrate, and the portion of the third metal film that is not connected to the third layer in the third metal film is directly provided on the insulating substrate. According to the present invention, since the major portions of the first metal film, the second metal film, and the third metal film can be directly provided on the insulating substrate, it is possible to provide a high-speed, large-output hetero-bipolar transistor having good heat dissipation characteristics, having high reliability, and which can be manufactured simply and easily.

An electronic device of the present invention can include the transistor. According to the present invention, it is possible to provide an electronic device including a higher-speed, large-output amplifier having good heat dissipation characteristics, high reliability, which is capable of being simply and easily manufactured. Thus, by forming a wireless device, such as a mobile phone or a wireless LAN having the transistor, it is possible to provide a higher-performance, inexpensive wireless device.

In a transistor manufacturing method of the present invention, a first metal film is provided on an insulating substrate, a first layer made of an N-type semiconductor is provided on the first metal film, a second layer made of a P-type semiconductor is provided on the first layer, a third layer made of an N-type semiconductor is provided on a part of the area of the second layer, a second metal film, which is connected to the second layer, is provided on the insulating substrate in such a manner as not to be in contact with the first metal film, and a third metal film, which is connected to the third layer, is provided on the insulating substrate in such a manner as not to be brought into contact with the first metal film and the second metal film. According to the present invention, it is possible to manufacture a bipolar transistor in which, for example, the first layer is a collector, the second layer is a base, the third layer is an emitter, the first metal film is a collector electrode or wiring, the second metal film is a base electrode or wiring, and the third metal film is an emitter electrode or wiring. Here, since the first layer which is a collector is directly formed on the first metal film, the heat dissipation characteristics are improved compared to a case in which a collector layer is directly formed on an insulating substrate, as in a conventional structure. Therefore, according to the present invention, it is possible to easily form a compact transistor having higher reliability and larger output power than the conventional transistor, which is capable of higher-speed operation.

In the transistor manufacturing method of the present invention, there can be provided a tile-shaped element including a first layer made of an N-type semiconductor, a second layer, which is provided on the first layer and which is made of a P-type semiconductor, a third layer, which is provided on a part of the area of the second layer and which is made of an N-type semiconductor, a first electrode provided on the bottom surface of the first layer, a second electrode provided in an area other than the part of area of the second layer, and a third electrode provided on the top surface of the third layer. A first metal film is provided on an insulating substrate. The tile-shaped element is arranged on the first metal film so that the first electrode of the tile-shaped element is connected to the first metal film. A second metal film connected to the second electrode is provided on the insulating substrate and on a part of the second electrode. A third metal film connected to the third electrode is provided on the insulating substrate and on a part of the third electrode.

According to the present invention, by providing a first metal film on an insulating substrate, by arranging a tile-shaped element on the first metal film, and by joining the first electrode of the tile-shaped element and the first metal film, it can be possible to simply and easily manufacture a high-performance bipolar transistor. More specifically, for example, the first layer of the tile-shaped element becomes the collector, the second layer is a base, and the third layer is an emitter. Furthermore, the first electrode of the tile-shaped element is a collector electrode, the second electrode is a base electrode, and the third electrode is an emitter electrode. Then, the first metal film is collector wiring. With such an arrangement, since heat generated at the collector, etc., is efficiently transmitted to the first metal film via the first electrode, the heat dissipation characteristics can be improved.

According to the manufacturing method of the present invention, the tile-shaped element can be arranged at a desired position of the first metal film, and the flexibility of arrangement of the transistor device element and the ease of changing the arrangement thereof can be improved. Furthermore, according to the present invention, the first layer, the second layer, and the third layer can be formed individually in advance as the tile-shaped element, and the first layer, the second layer, and the third layer can be individually checked and selected. Thus, a high-quality transistor can be easily provided.

In the transistor manufacturing method of the present invention, preferably, the first layer is formed so as to function as a collector, the second layer is formed so as to function as a base, the third layer is formed so as to function as an emitter, the first metal film is formed so as to function as a collector electrode or collector wiring, the second metal film is formed so as to function as a base electrode or base wiring, and the third metal film is formed so as to function as an emitter electrode or emitter wiring.

According to the present invention, for example, by inputting an electrical signal to the second metal film with the first metal film at a grounding potential and by applying a bias voltage to the third metal film via a resistor, etc., it is possible to manufacture a high-gain amplification circuit capable of amplifying a high-frequency signal. Furthermore, according to the present invention, for example, the first metal film can be made to function as collector wiring, the second metal film can be made to function as base wiring, and the third metal film can be made to function as emitter wiring. As a result, it is possible to easily manufacture a compact transistor having good heat dissipation characteristics and high reliability, which is capable of easily increasing driving power, and capable of high-speed operation.

In the transistor manufacturing method of the present invention, preferably, the first layer, the second layer, and the third layer are formed so as to cross over the top surface of the first metal film. According to the present invention, for example, when a plurality of NPN structures formed of the first layer, the second layer, and the third layer are provided on one first metal film, the second metal film to which the electrode (base electrode) of each second layer is connected can be provided on one side of the first metal film, and the third metal film to which the electrode (emitter electrode) of each third layer is connected can be provided on the other side of the second metal film. Accordingly, a plurality of unit elements (transistors) are formed on one first metal film, and the three terminals of each unit element can be correspondingly connected by the first metal film, the second metal film, and the third metal film, which are directly formed on the insulating substrate. Therefore, according to the manufacturing method of the present invention, since, whereas a plurality of unit elements are connected in parallel, the intersection of the wiring can be avoided, it is possible to manufacture a larger-output transistor capable of operating at a higher speed due to the fact that no capacitance is generated in the intersection portion.

In the transistor manufacturing method of the present invention, preferably, the first layer is formed by an N-type semiconductor made of gallium and arsenic, the second layer is formed by a P-type semiconductor made of gallium and arsenic, and the third layer is formed by an N-type semiconductor made of aluminum, gallium, and arsenic.

According to the present invention, a hetero-bipolar transistor can be formed simply and easily. Furthermore, according to the present invention, a plurality of unit elements which form a hetero-bipolar transistor can be arranged on one first metal film, and the plurality of the unit elements can be connected in parallel so that a three-dimensional intersection of wiring does not occur. Therefore, according to the present invention, it is possible to simply and easily manufacture a hetero-bipolar transistor capable of a larger output and which operates at a higher speed than conventionally.

Furthermore, in the transistor manufacturing method of the present invention, preferably, a plurality of the tile-shaped elements are arranged on the one first metal film with a fixed spacing, the first electrode of each of the tile-shaped elements is joined to the first metal film, the second electrode of each of the tile-shaped elements is joined to the second metal film, and the third electrode of each of the tile-shaped elements is joined to the third metal film.

According to the present invention, a plurality of hetero-bipolar transistors (unit elements) can be connected in parallel in such a manner that one first metal film is used as common collector wiring, one second metal film is used as common base wiring, and one third metal film is used as common emitter wiring. Here, since the first metal film, the second metal film, and the third metal film, by which the unit elements are connected in parallel, are each directly formed on an insulating substrate, there is no three-dimensional intersection of the wiring. Therefore, according to the present invention, a hetero-bipolar transistor capable of a large output and which operates at a higher speed than conventionally can be simply and easily manufactured.

Furthermore, according to the present invention, for example, by making portions connected to the electrode of each unit element in each of the first metal film, the second metal film, and the third metal film the same shape for each unit element, the wiring shapes of the unit elements can be made the same. Therefore, according to the present invention, it is possible to simply and easily manufacture a hetero-bipolar transistor in which unit elements whose characteristics are matched with one another are connected in parallel.

Furthermore, according to the present invention, since the first metal film, the second metal film, and the third metal film formed on the insulating substrate are directly connected to the electrodes of each unit element, there is no need to provide a via hole for adjusting the wiring length to each electrode of each unit element, and a high-performance hetero-bipolar transistor can be provided through simple and easy manufacturing steps.

In the transistor manufacturing method of the present invention, preferably, the second layer and the portion other than the portion connected to the second electrode in the second metal film are directly provided on the insulating substrate, and the third layer and the portion other than the portion connected to the third electrode in the third metal film are directly provided on the insulating substrate. According to the present invention, since the common collector wiring, the common base wiring, and the common emitter wiring are directly formed on the insulating substrate, there is no three-dimensional intersection of the wiring. Therefore, according to the present invention, a hetero-bipolar transistor capable of a large output, which operates at a higher speed than conventionally, can be manufactured simply and easily.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENTS

A hetero-bipolar transistor according to an embodiment of the present invention will now be described below with reference to the drawings.

Figure 1:
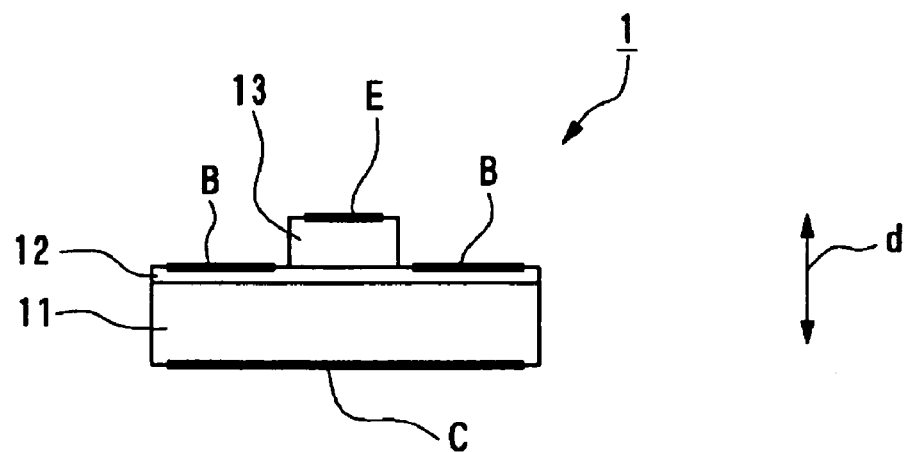
FIG. 1 is a schematic side view of a unit element according to the embodiment of the present invention.

FIG. 1 is a schematic side view showing one hetero-bipolar transistor element (unit element) according to the embodiment of the present invention. A unit element 1 includes a first layer 11 made of an N-type semiconductor, a second layer 12, which is provided on the first layer 11 and which is made of a P-type semiconductor, and a third layer 13, which is provided on the second layer 12 and which is made of an N-type semiconductor.

The second layer 12 can be formed on the entire top surface of the first layer 11, and is thinner than the first layer 11 and the third layer 13. The third layer 13 is provided in such a manner as to cross the center of the top surface of the second layer, and the area of the top surface is smaller than the area of the top surface of the first layer 11 and the second layer 12. The side surfaces of the first layer 11, the second layer 12, and the third layer 13 may be formed vertically, and may also be formed in a tapered shape.

Nearly the entire bottom surface of the first layer 11 is provided with a collector electrode C (first electrode) made of a metal film. The portion on the top surface of the second layer 12, where the third layer is not provided, that is, the two side portions on the top surface of the second layer 12, is provided with a base electrode B (second electrode) made of a metal film. Nearly the entire top surface of the third layer is provided with an emitter electrode E (third electrode) made of a metal film.

Each thickness of the collector electrode C, the base electrode B, and the emitter electrode E is greatly thinner than the first layer 11, the second layer 12, and the third layer 13. Then, the thickness d of the unit element 1, which forms the hetero-bipolar transistor, is a total value of the respective thicknesses of the first layer 11, the second layer 12, and the third layer 13, and the respective thicknesses of the collector electrode C and the emitter electrode E, and is set at, for example, several μm.

The first layer 11 is formed by an N-type semiconductor made of, for example, gallium and arsenic (GaAs). The second layer 12 is formed by a P-type semiconductor made of, for example, gallium and arsenic (GaAs). The third layer 13 is formed by an N-type semiconductor made of, for example, aluminum, gallium, and arsenic (AlGaAs). With such a structure, the first layer 11 functions as a collector, the second layer 12 functions as a base, and the third layer 13 functions as an emitter. With such a structure, the unit element 1 forms a gallium-arsenic (GaAs) type hetero-bipolar transistor. Therefore, by arranging this unit element 1 at a desired position on a substrate, a high-speed amplification circuit on the order of Gigahertz, or the like, can be formed at the desired position.

Furthermore, the unit element 1 is preferably formed as a very small tile-shaped semiconductor device (tile-shaped element). This tile-shaped element is, for example, a plate-shaped member having a thickness of several μm or less and whose length and breadth is from several μm to several hundred μm. The method for manufacturing the tile-shaped element will be described later in detail. As described above, by forming the unit element 1 as a tile-shaped element, a high-speed amplification circuit element on the order of Gigahertz, or the like, can be formed in a very compact manner, and the circuit can be simply and easily pasted at a desired position on the substrate.

By changing the materials forming the first layer 11, the second layer 12, and the third layer 13, the unit element 1 can form a silicon germanium (SiGe) hetero-bipolar transistor, an indium-phosphorus (InP) type hetero-bipolar transistor, or an indium-gallium-phosphorus (InGaP) type hetero-bipolar transistor.

Figure 2:
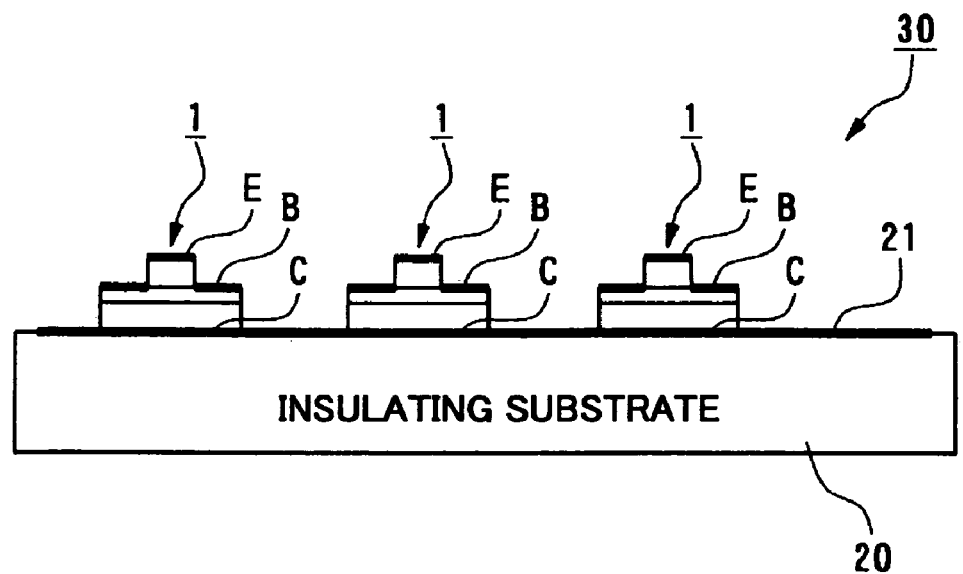
FIG. 2 is a schematic side view of an HBT according to the embodiment of the present invention.
Figure 3:
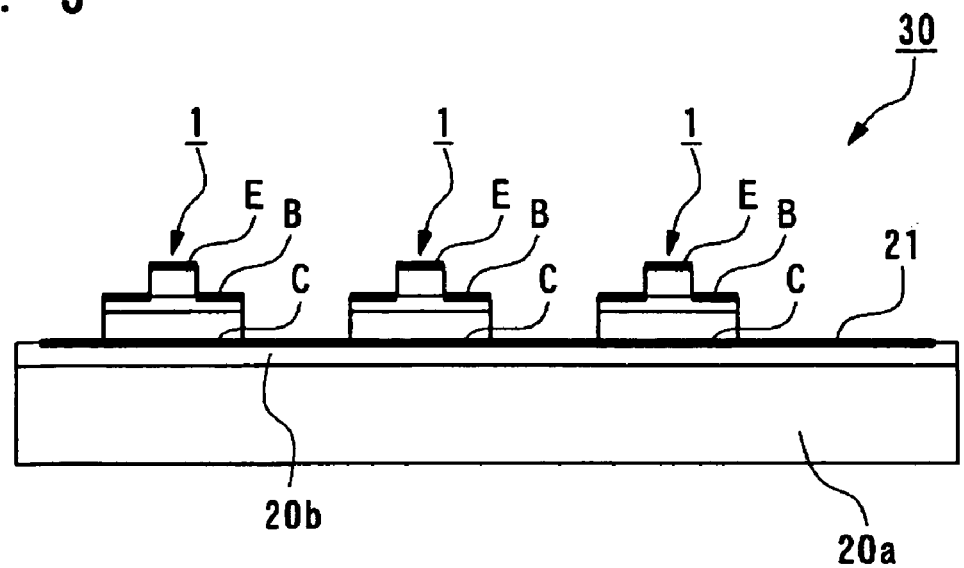
FIG. 3 is a schematic side view showing a modification of the HBT according to the embodiment of the present invention.
Figure 4:
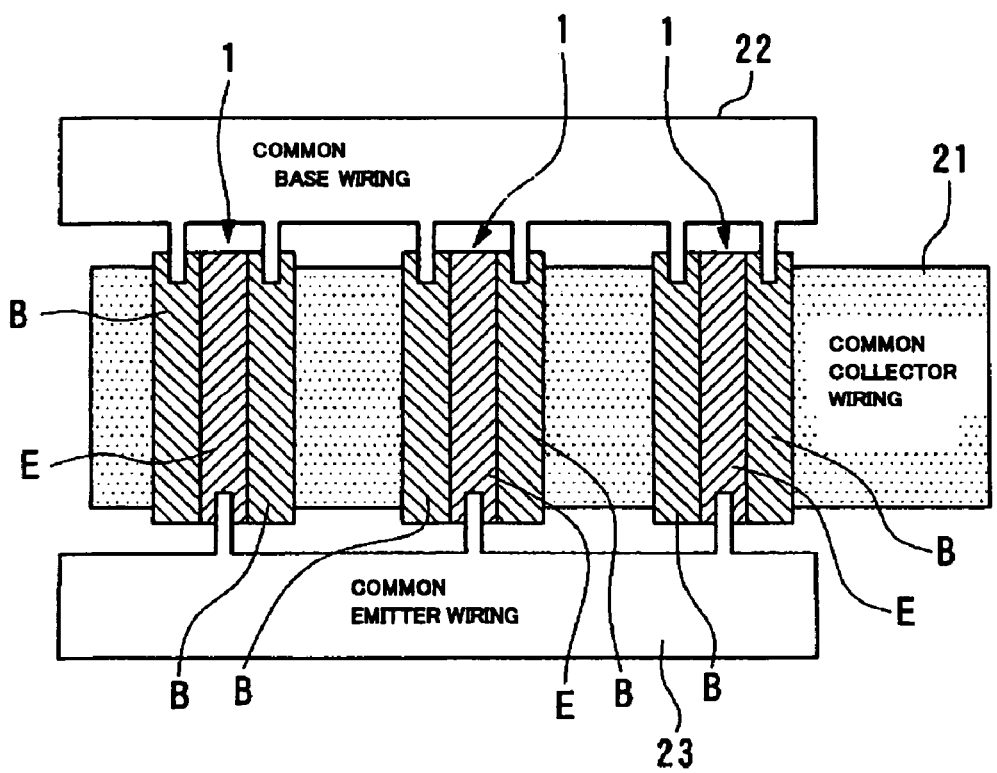
FIG. 4 is a schematic plan view showing the HBT according to the embodiment of the present invention.

Next, a structure in which the unit elements 1 are connected in parallel to form one large output hetero-bipolar transistor 30 will be described with reference to FIGS. 2 to 4. FIG. 2 is a schematic side view showing the structure of the hetero-bipolar transistor (HBT) 30 according to the embodiment of the present invention. FIG. 3 shows a modification of the hetero-bipolar transistor shown in FIG. 2. FIG. 4 is a schematic plan view showing the structure of the hetero-bipolar transistor 30 shown in FIG. 2.

On the top surface of one insulating substrate 20, common collector wiring 21 made of a first metal film is formed in a rectangular shape. On the top surface of the common collector wiring 21, a plurality of unit elements 1 are joined. It is preferable that the unit elements 1 be arranged with a fixed spacing. This is for the purpose of making the electrical characteristics of the unit elements 1 matched. Each unit element 1 is formed in the shape of a rectangular tile. Here, in each unit element 1, the third layer 13 has a shape which is longer and narrower than that of the first layer 11 and the second layer 12, and the third layer 13 is formed in such a manner as to cross on the second layer.

Furthermore, each unit element 1 is provided and arranged in such a manner that the first layer, the second layer, the third layer, the collector electrode C, the base electrode B, and the emitter electrode E cross the common collector wiring 21. The width of the common collector wiring 21 may be smaller than the longitudinal length of the unit element 1. Preferably, the width of the common collector wiring 21 is made to nearly match the longitudinal length of the unit element 1. In other words, the above are provided so that both end sides in the longitudinal direction of the first layer, the second layer, the third layer, the collector electrode C, the base electrode B, and the emitter electrode E nearly match both end sides in the longitudinal direction of the common collector wiring 21.

The collector electrode C of each unit element 1 and the common collector wiring 21 are joined to each other at least in an electrical manner. Here, the collector electrode C of each unit element 1 and the common collector wiring 21 may also be joined to each other electrically and mechanically.

Furthermore, on the insulating substrate 20, common base wiring 22 made of a second metal film, and common emitter wiring 23 made of a third metal film are formed. The common base wiring 22 is formed in a rectangular shape along one side in the longitudinal direction of the common collector wiring 21, and are not in contact with the common collector wiring 21 and the common emitter wiring 23.

Then, the common base wiring 22 is electrically joined to the base electrode B of each unit element 1 by a connection section provided in a protruding shape on one side in the longitudinal direction of the rectangle. Therefore, the base electrodes B of the unit elements 1 are electrically connected by the common base wiring 22.

The common emitter wiring 23 is formed in a rectangular shape along one side (the opposite side of the common base wiring 22) in the longitudinal direction of the common collector wiring 21. Then, the common emitter wiring 23 is electrically joined to the emitter electrode E of each unit element 1 by a connection section provided in a protruding shape on one side in the longitudinal direction of the rectangle. Therefore, the emitter electrodes E of the unit elements 1 are electrically connected by the common emitter wiring 23.

As a result of the above, according to this embodiment, whereas the common collector wiring (the first metal film) 21, the common base wiring (the second metal film) 22, and the common emitter wiring (the third metal film) 23, which are wirings that connect the unit elements 1 in parallel, are directly formed on the insulating substrate 20, these wirings do not contact one another or do not intersect one another. Therefore, according to this embodiment, since a plurality of unit elements (hetero-bipolar transistors) provided on the substrate plane can be connected in parallel without requiring air-gap wiring, it is possible to easily manufacture a hetero-bipolar transistor which operates at a higher speed and whose output is larger than conventionally.

Furthermore, according to this embodiment, since the first layer 11 (the collector layer) of each unit element 1 is directly joined via the collector electrode C to one common collector wiring 21 provided on the insulating substrate 20, the heat dissipation characteristics can be improved compared to a case where the collector layer is directly formed on the insulating substrate as in the conventional structure.

As a result, according to this embodiment, it is possible to easily form a compact hetero-bipolar transistor, in which the reliability can be improved and the driving power can be easily increased, which is capable of operating at a higher speed than conventionally.

The hetero-bipolar transistor 30 of this embodiment can be used in, for example, an emitter-grounded amplification circuit, and is suitable for use in a power amplifier for wireless communication of a several GHz band. Therefore, by forming a wireless device, such as a mobile phone or a wireless LAN including the hetero-bipolar transistor 30, a higher-performance, inexpensive wireless device can be provided. Furthermore, the hetero-bipolar transistor 30 of this embodiment can be used in a base-grounded amplification circuit or a collector-grounded amplification circuit, and can also be used in an oscillation circuit.

The hetero-bipolar transistor shown in FIG. 3 is such that the insulating substrate 20 of the hetero-bipolar transistor 30 shown in FIG. 2 is replaced with a conductor substrate 20a and an insulating film 20b. That is, in the hetero-bipolar transistor shown in FIG. 3, the insulating film 20b is formed on the surface of the conductor substrate 20a. Then, on the top surface of the insulating film 20b, common collector wiring, common base wiring, and common emitter wiring are formed. The remaining construction is the same as that of the hetero-bipolar transistor 30 shown in FIG. 2 in that a plurality of unit elements 1 are provided in the common collector wiring, the collector electrode of each unit element 1 is connected to the common collector wiring, the base electrode of each unit element 1 is connected to the common base wiring, and the emitter electrode of each unit element 1 is connected to the common emitter wiring.

A description will now be given, with reference to FIGS. 5 to 15, a method for manufacturing a tile-shaped element which forms the unit element 1 and a method for bonding the very small tile-shaped element to the insulating substrate 20 (final substrate). In this method for manufacturing the tile-shaped element, an epitaxial lift-off method is used as a basis. Furthermore, in this manufacturing method, a description is given of a case in which a compound semiconductor device (compound semiconductor element) as a tile-shaped element is bonded to a silicon LSI chip, which is a final substrate. However, the present invention can be applied regardless of the type of semiconductor device and the type of LSI chip. The semiconductor substrate in this embodiment refers to an object made of a semiconductor material, but is not limited to a plate-shaped substrate; any semiconductor material no matter what shape it has is included in semiconductor substrate.

Figure 5:
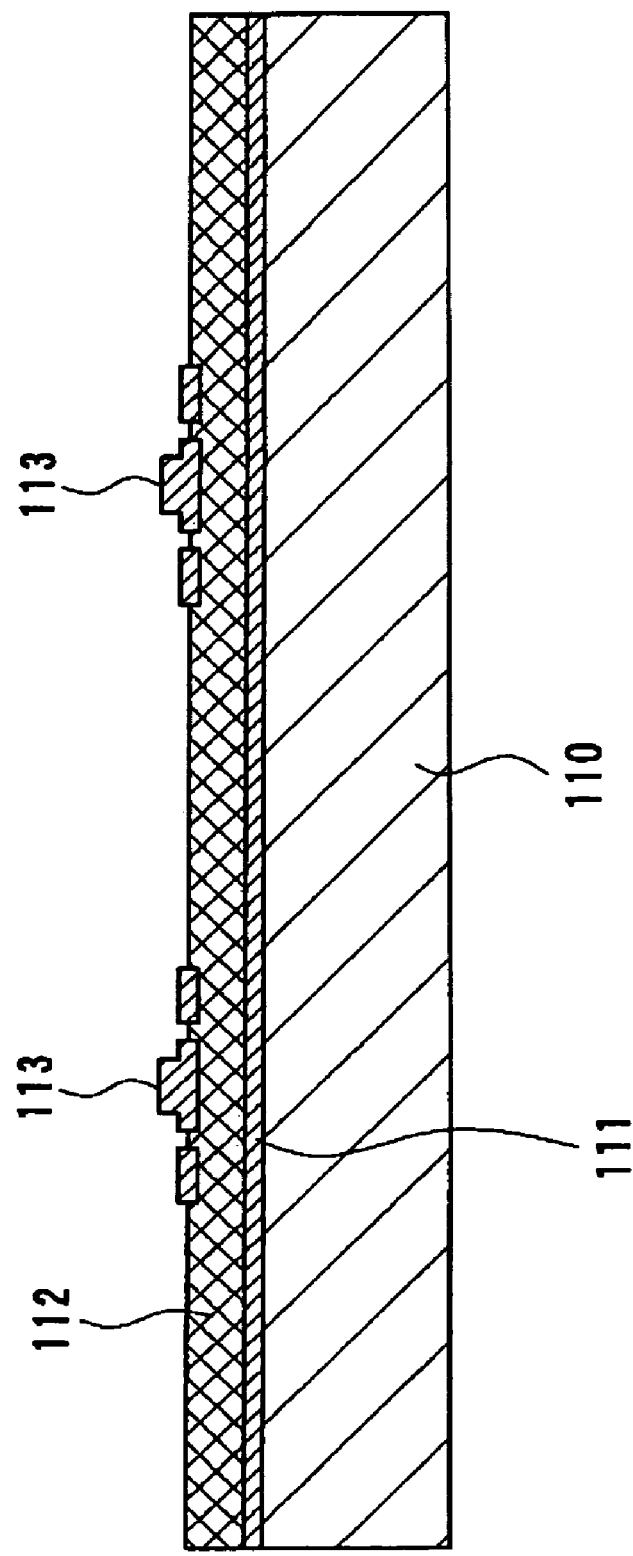
FIG. 5 is a schematic sectional view showing a first step of a method for manufacturing a tile-shaped element.

FIG. 5 is a schematic sectional view showing a first step of this method for manufacturing a semiconductor integrated circuit. In FIG. 5, a substrate 10 is a semiconductor substrate, for example, it is a gallium-arsenic compound semiconductor substrate. In the bottommost layer in the substrate 10, a sacrifice layer 111 is provided.

The sacrifice layer 111 is made of aluminum and arsenic (AlAs), and is a layer having a thickness of, for example, several hundred nm. For example, on the sacrifice layer 111, a function layer 112 is provided. The thickness of the function layer 112 is, for example, approximately from 1 µm to 10 (20) µm. Then, in the function layer 112, a semiconductor device (unit element 1) 113 is produced. As the semiconductor device 113, for example, instead of the unit element 1 or together with the unit element 1, a plurality of hetero-bipolar transistors (HBT), high-electron-mobility transistors (HEMT), or APC circuits may be formed. Every one of these semiconductor devices 113 is such that many epitaxial layers are layered on the substrate 110, forming an element. Furthermore, electrodes are also formed in each semiconductor device 113, and operation tests are performed.

Figure 6:
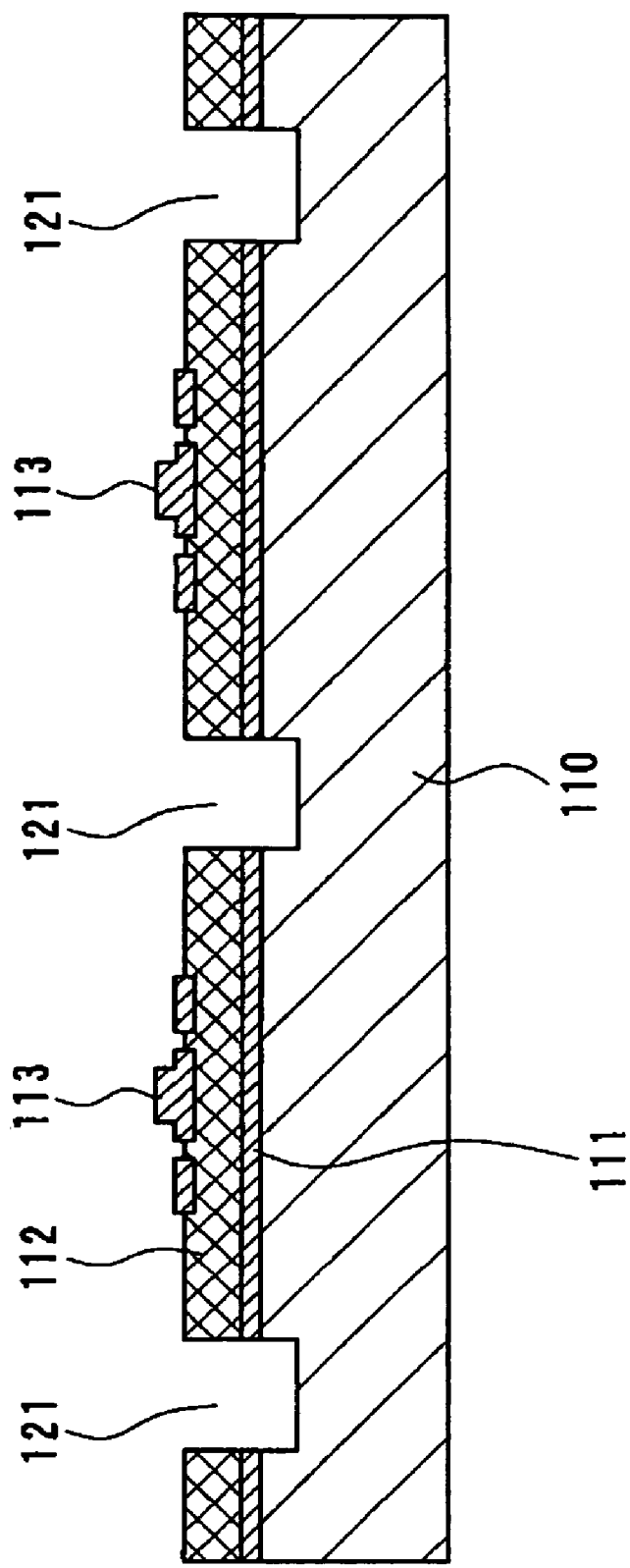
FIG. 6 is a schematic sectional view showing a second step of the method for manufacturing a tile-shaped element.

FIG. 6 is a schematic sectional view showing a second step of this method for manufacturing a semiconductor integrated circuit. In this step, a separation groove 121 can be formed so as to divide each semiconductor device 113. The separation groove 121 is formed as a groove having at least a depth which reaches the sacrifice layer 111.

For example, both the width and the depth of the separation groove are set at 10 µm to several hundred µm. Furthermore, the separation groove 121 is formed as a continuous groove without a dead end so that a selective etching solution (to be described later) flows through the separation groove 121. Furthermore, preferably, the separation groove 121 is formed in a lattice shape.

Furthermore, by making the spacing between the separation grooves 121 several ten µm to several hundred µm, the size of each semiconductor device 113, divided and formed by the separation groove 121, has a square area of several ten µm to several hundred µm. As a method for forming the separation groove 121, a method using photolithography or wet etching, or a method using dry etching is used. Furthermore, the separation groove 121 may be formed by dicing of a U-shaped groove in the range where a crack does not occur in the substrate.

Figure 7:
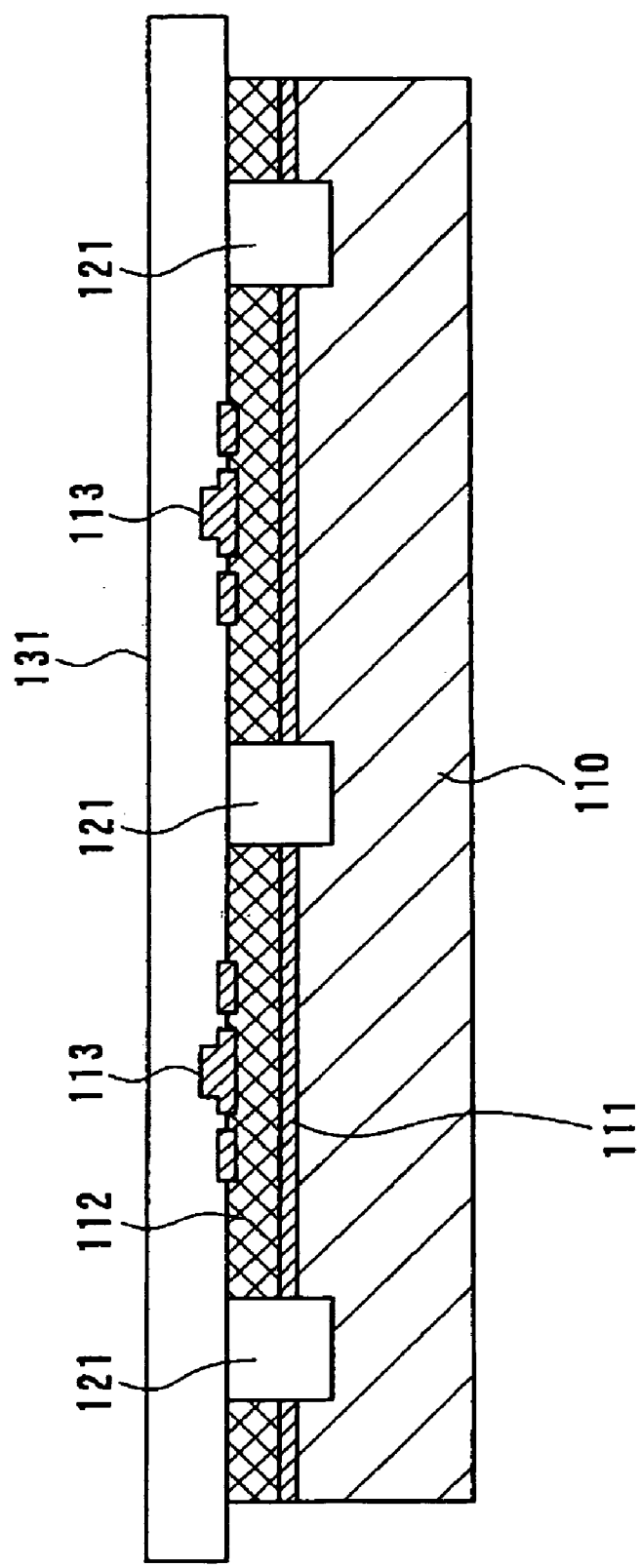
FIG. 7 is a schematic sectional view showing a third step of the method for manufacturing a tile-shaped element.

FIG. 7 is a schematic sectional view showing a third step of this method for manufacturing a semiconductor integrated circuit. In this step, an intermediate transfer film 131 is pasted to the surface (the semiconductor device 113 side) of the substrate 110. The intermediate transfer film 131 is a flexible film having an adhesive coated on its surface.

Figure 8:
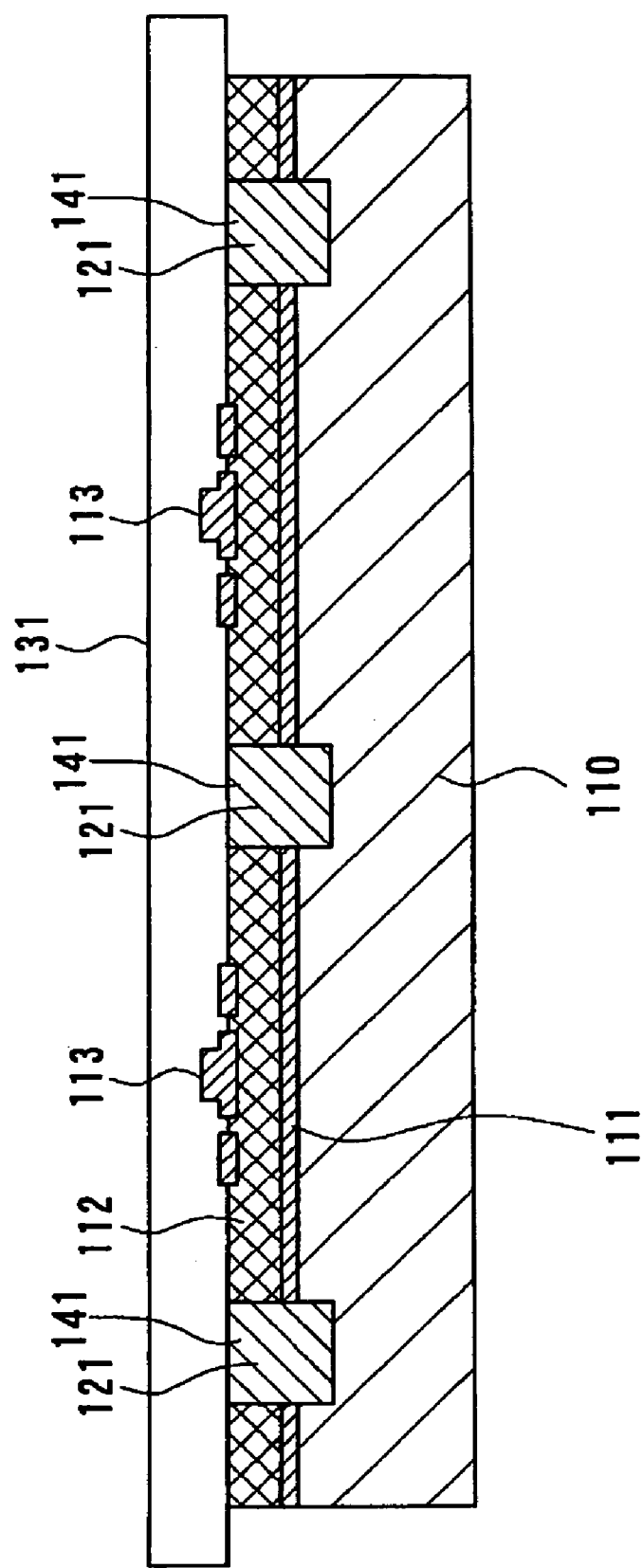
FIG. 8 is a schematic sectional view showing a fourth step of the method for manufacturing a tile-shaped element.

FIG. 8 is a schematic sectional view showing a fourth step of this method for manufacturing a semiconductor integrated circuit. In this step, a selective etching solution 141 is injected to the separation groove 121. In this step, since only the sacrifice layer 111 is selectively etched, as the selective etching solution 141, low-concentration hydrochloric acid having a high selectivity with respect to aluminum and arsenic is used.

Figure 9:
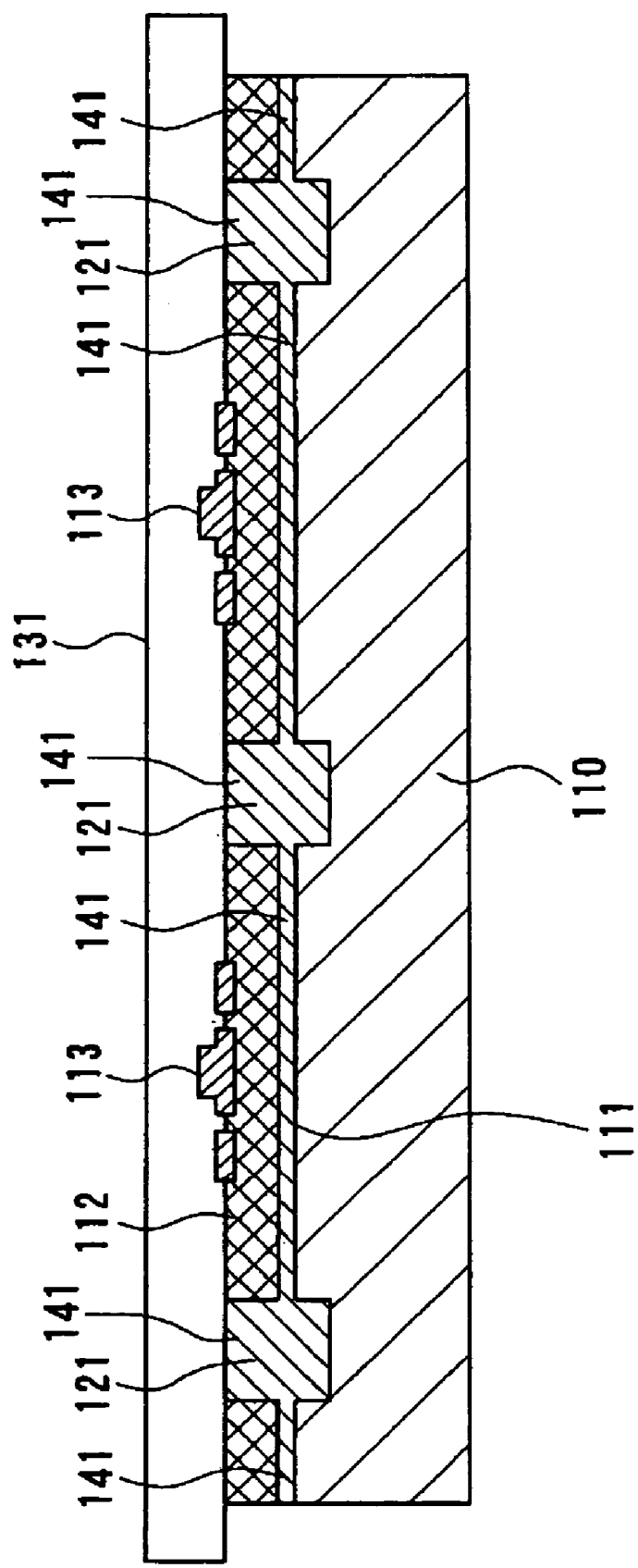
FIG. 9 is a schematic sectional view showing a fifth step of the method for manufacturing a tile-shaped element.

FIG. 9 is a schematic sectional view showing a fifth step of this method for manufacturing a semiconductor integrated circuit. In this step, after the injection of the selective etching solution 141 to the separation groove 121 in the fourth step, all the sacrifice layer 111 is removed from the unit elements 110 by selective etching by passage of predetermined time.

Figure 10:
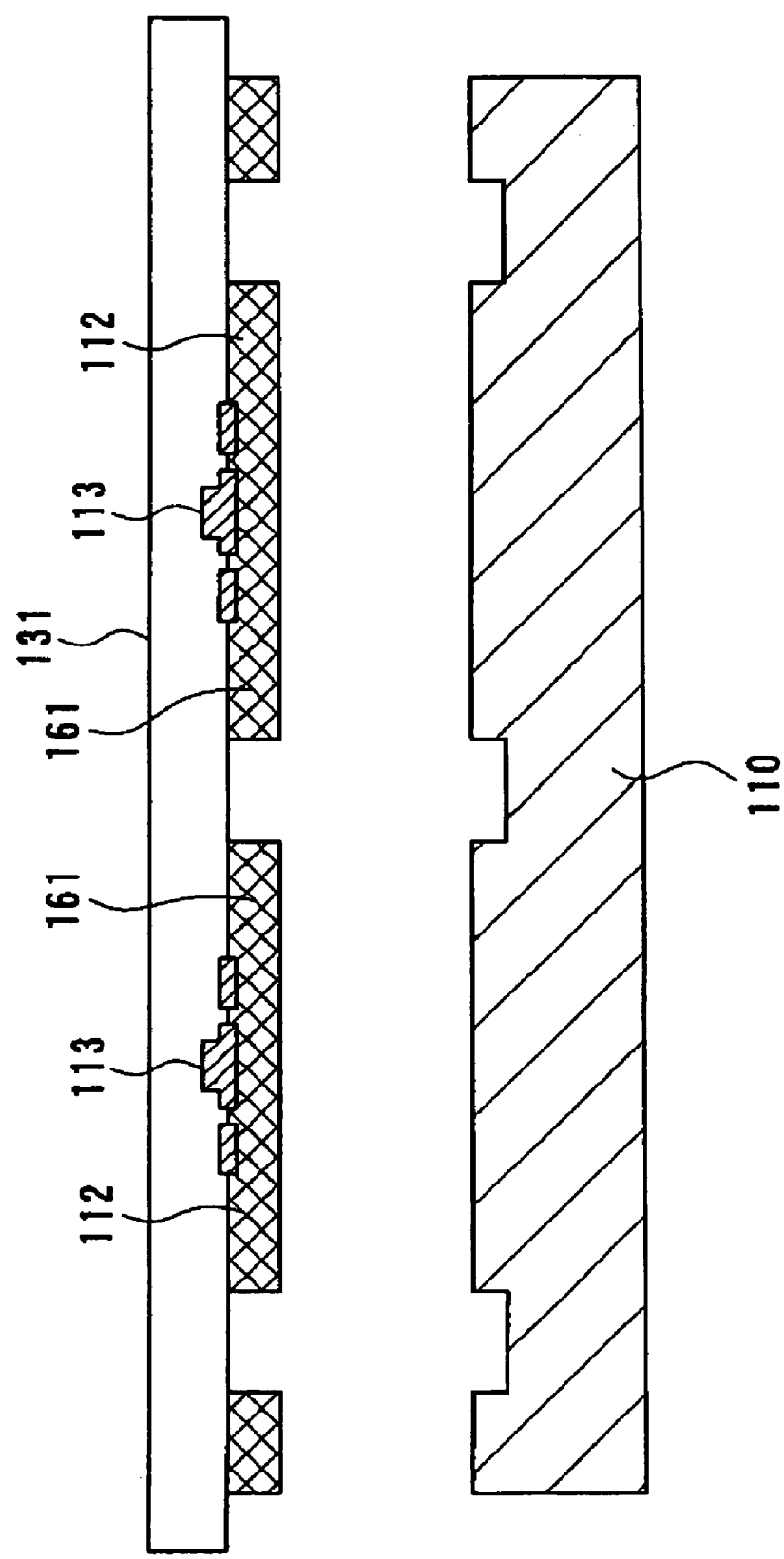
FIG. 10 is a schematic sectional view showing a sixth step of the method for manufacturing a tile-shaped element.
Figure 11:
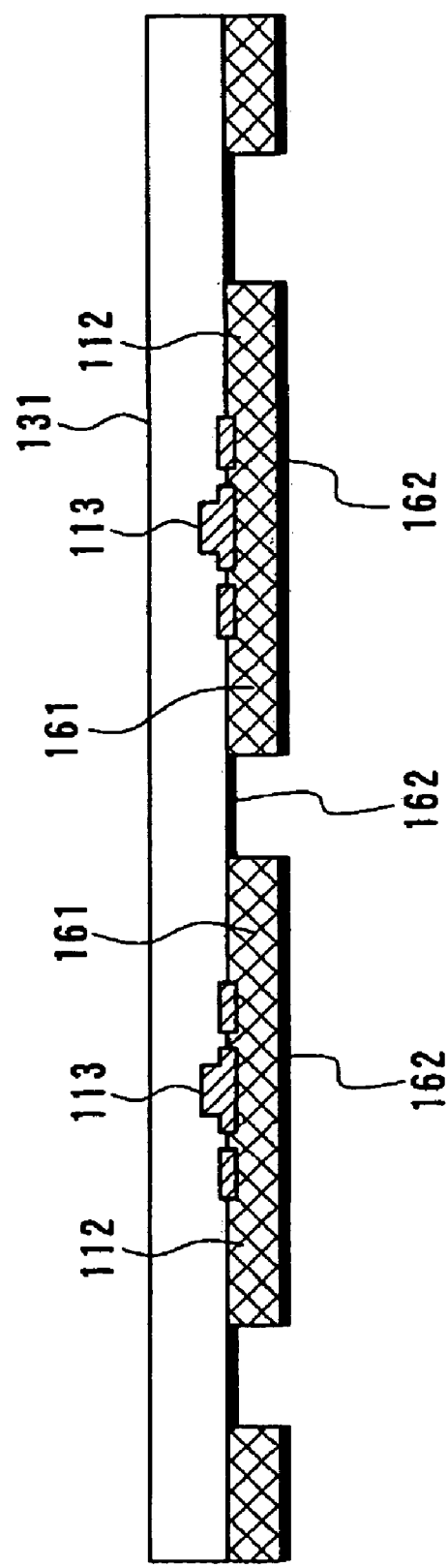
FIG. 11 is a schematic sectional view showing a sixth step of the method for manufacturing a tile-shaped element.

FIGS. 10 and 11 are schematic sectional views showing a sixth step of this method for manufacturing a semiconductor integrated circuit. When all the sacrifice layer 111 is etched in the fifth step, the function layer 112 is separated from the substrate 110. Then, in this step, by separating the intermediate transfer film 131 from the substrate 110, the function layer 112 pasted to the intermediate transfer film 131 is separated from the substrate 110.

As a result of the above, the function layer 112 on which the semiconductor device 113 is formed is divided by the formation of the separation groove 121 and by the etching of the sacrifice layer 111, being formed as a semiconductor element (the unit element 1 of the above-described embodiment) in a predetermined shape (for example, in the shape of a tile-shaped element), and it is pasted and held in the intermediate transfer film 131. Here, preferably, the thickness of the function layer is, for example, from approximately 1 µm to 10 µm, and the size (the length and breadth) is, for example, from several ten µm to several hundred µm.

Next, as shown in FIG. 11, a metal film 162 is formed on the rear surface side of the intermediate transfer film 131, and the collector electrode C is formed on the bottom surface of the function layer 112. That is, since the function layer 112 is held with its rear surface exposed, in the intermediate transfer film 131, the metal film 162 is formed on the rear surface side of the intermediate transfer film 131 by a vapor deposition method or a sputtering method. Here, as the metal film 162, a material by which ohmic contact with an N-type compound semiconductor can be obtained is preferable. For example, an alloy of gold (Au) and germanium (Ge), a multilayer of nickel (Ni) and gold (Au), or a multilayered film of titanium (Ti) and gold (Au) can be used as the metal film 162.

Figure 12:
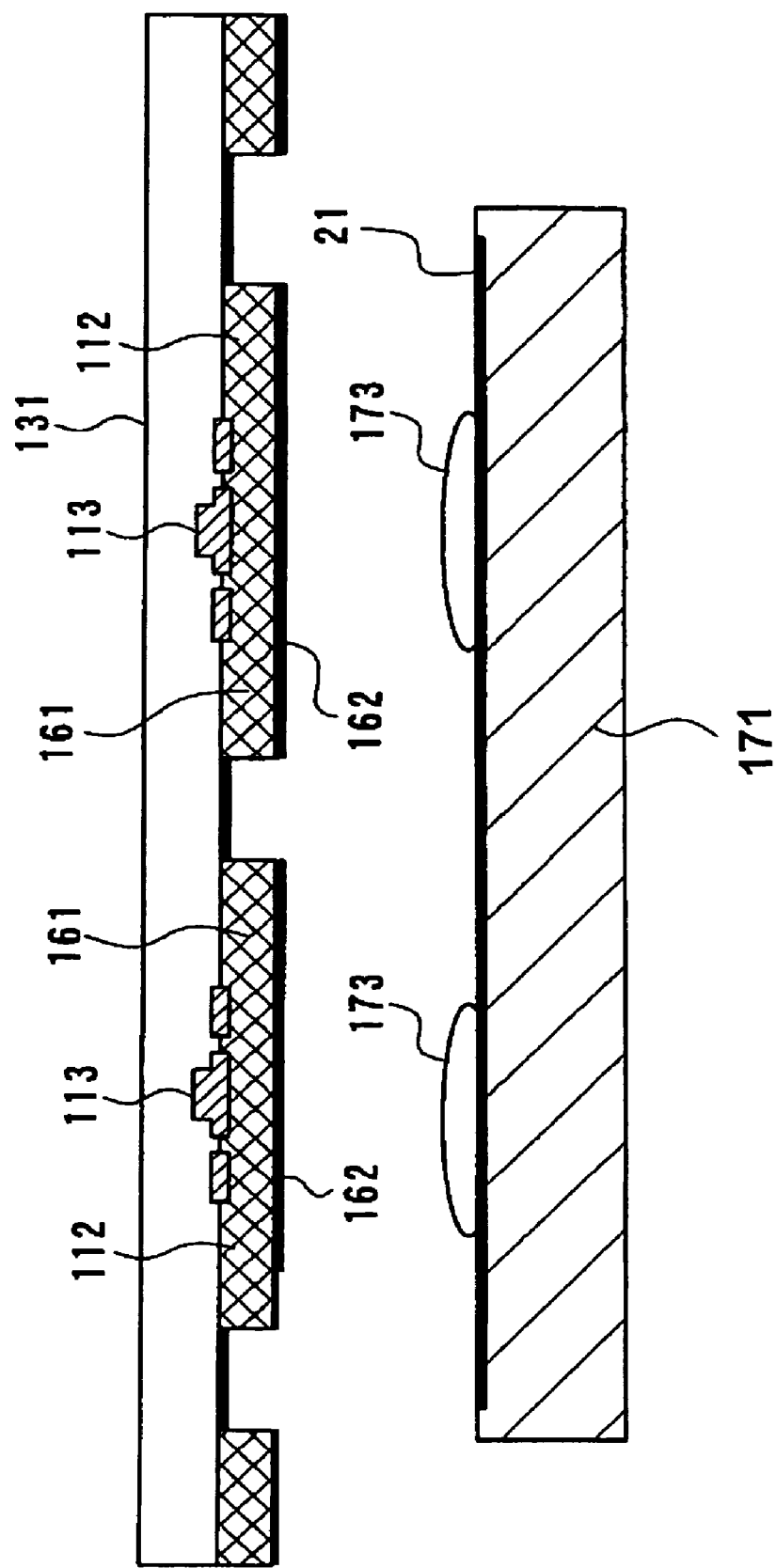
FIG. 12 is a schematic sectional view showing a seventh step of the method for manufacturing a tile-shaped element.

FIG. 12 is a schematic sectional view showing a seventh step of this method for manufacturing a semiconductor integrated circuit. In this step, by moving the intermediate transfer film 131 (to which a tile-shaped element 161 is pasted), the tile-shaped element 161 (the unit element 1) is aligned to a desired position (the top surface of the common collector wiring 21) of a final substrate 171 (the insulating substrate 20). Here, the final substrate 171 is formed of, for example, a silicon semiconductor, with an LSI area 172 being formed therein. Furthermore, at a desired position of the final substrate 171, a bonding agent 173 for bonding the tile-shaped element 161 is coated in advance. The bonding agent may be coated in the tile-shaped element. For the bonding agent 173, a bonding agent having high conductivity is preferable.

Figure 13:
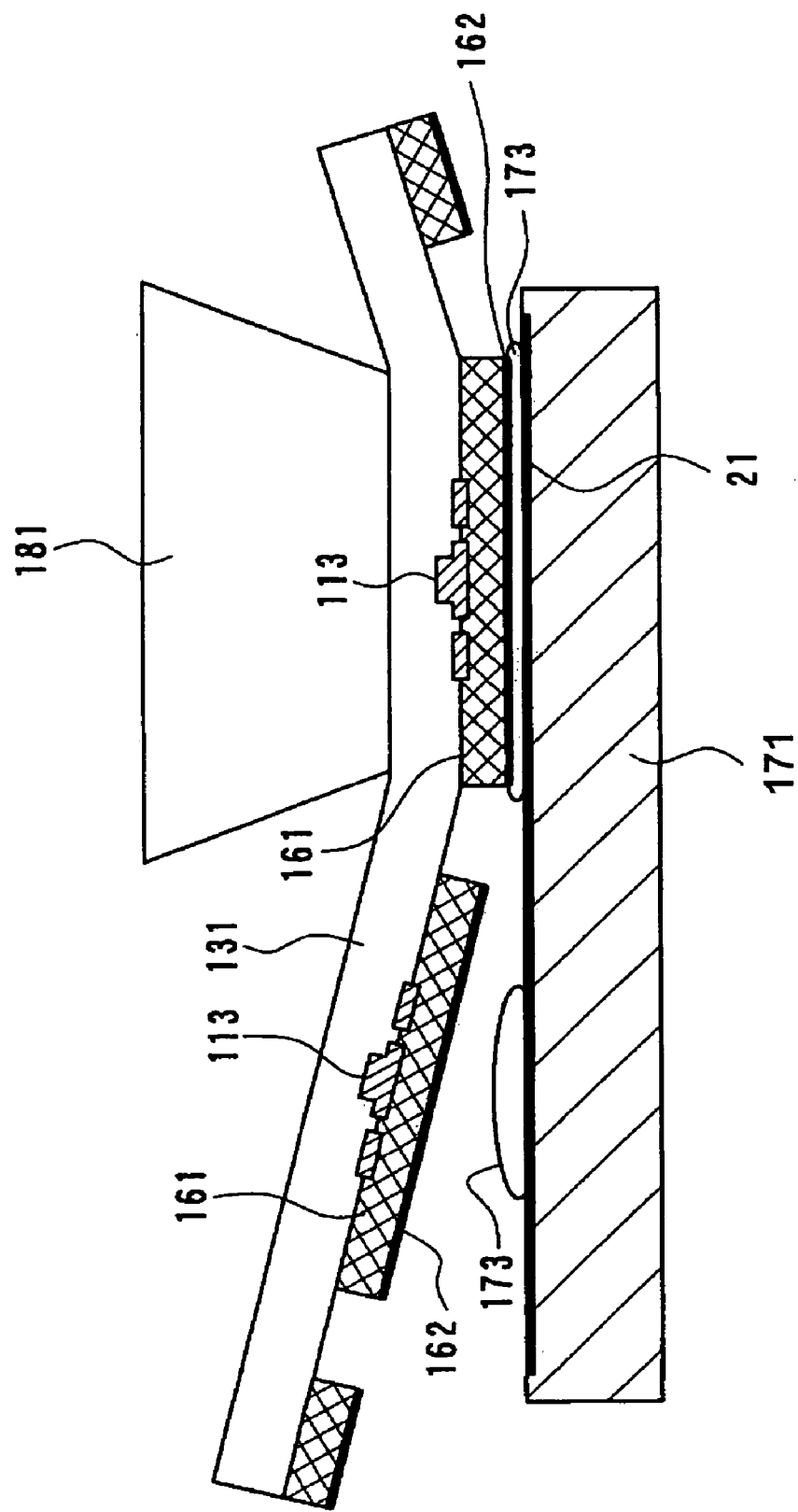
FIG. 13 is a schematic sectional view showing an eighth step of the method for manufacturing a tile-shaped element.

FIG. 13 is a schematic sectional view showing an eighth step of this method for manufacturing a semiconductor integrated circuit. In this step, the tile-shaped element 161 aligned to the desired position (the top surface of the common collector wiring 21) of the final substrate 171 is pressed through the intermediate transfer film 131 by a rear pressing jig 181 so as to be joined to the final substrate 171. Here, since the bonding agent 173 is coated at the desired position, the tile-shaped element 161 is bonded at the desired position of the final substrate 171. As a result, the collector electrode of the unit element 1 is electrically connected to the top surface of the common collector wiring 21.

Figure 14:
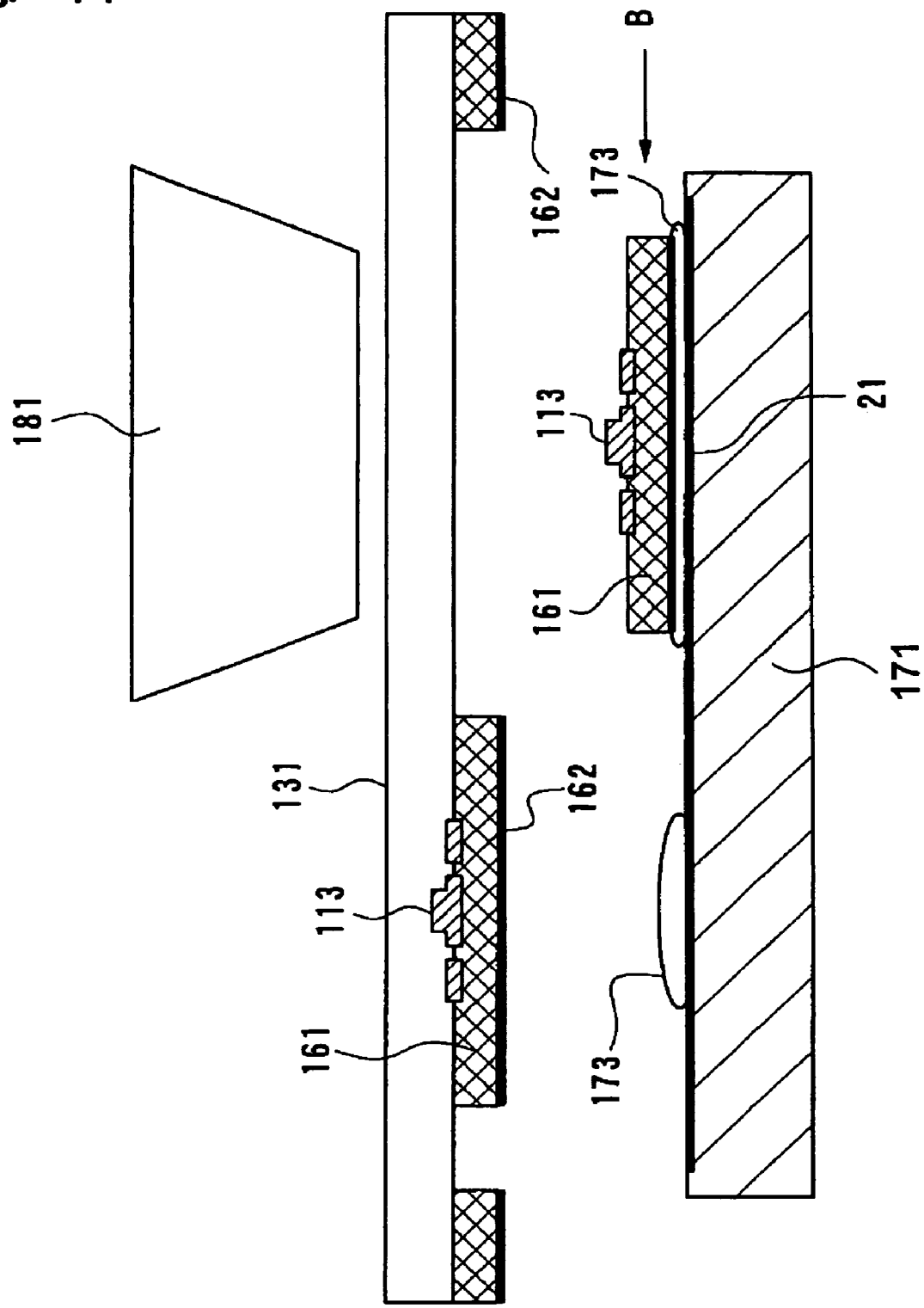
FIG. 14 is the schematic sectional view showing a ninth step of the method for manufacturing a tile-shaped element.

FIG. 14 is a schematic sectional view showing a ninth step of this method for manufacturing a semiconductor integrated circuit. In this step, by causing the adhesive strength of the intermediate transfer film 131 to be erased, the intermediate transfer film 131 is peeled off from the tile-shaped element 161.

For the adhesive of the intermediate transfer film 131, an adhesive having UV curing properties or heat curing properties is used. In the case of an adhesive having UV curing properties, for the rear pressing jig 181, a transparent material is used, and by radiating ultraviolet rays (UV) from the front end of the rear pressing jig 181, the adhesive strength of the intermediate transfer film 131 is erased. In the case of an adhesive having heat curing properties, the rear pressing jig 181 may be heated. Alternatively, after the sixth step, the adhesive strength may be erased from the entire surface by irradiating the entire surface of the intermediate transfer film 131 with ultraviolet rays. Although the adhesive strength is erased, in practice, the adhesive strength slightly remains, and since the tile-shaped element 161 is very thin and light, it is held in the intermediate transfer film 131.

This step is not shown. In this step, by performing a heating process, etc., the tile-shaped element 161 is fully joined to the final substrate 171.

Figure 15:
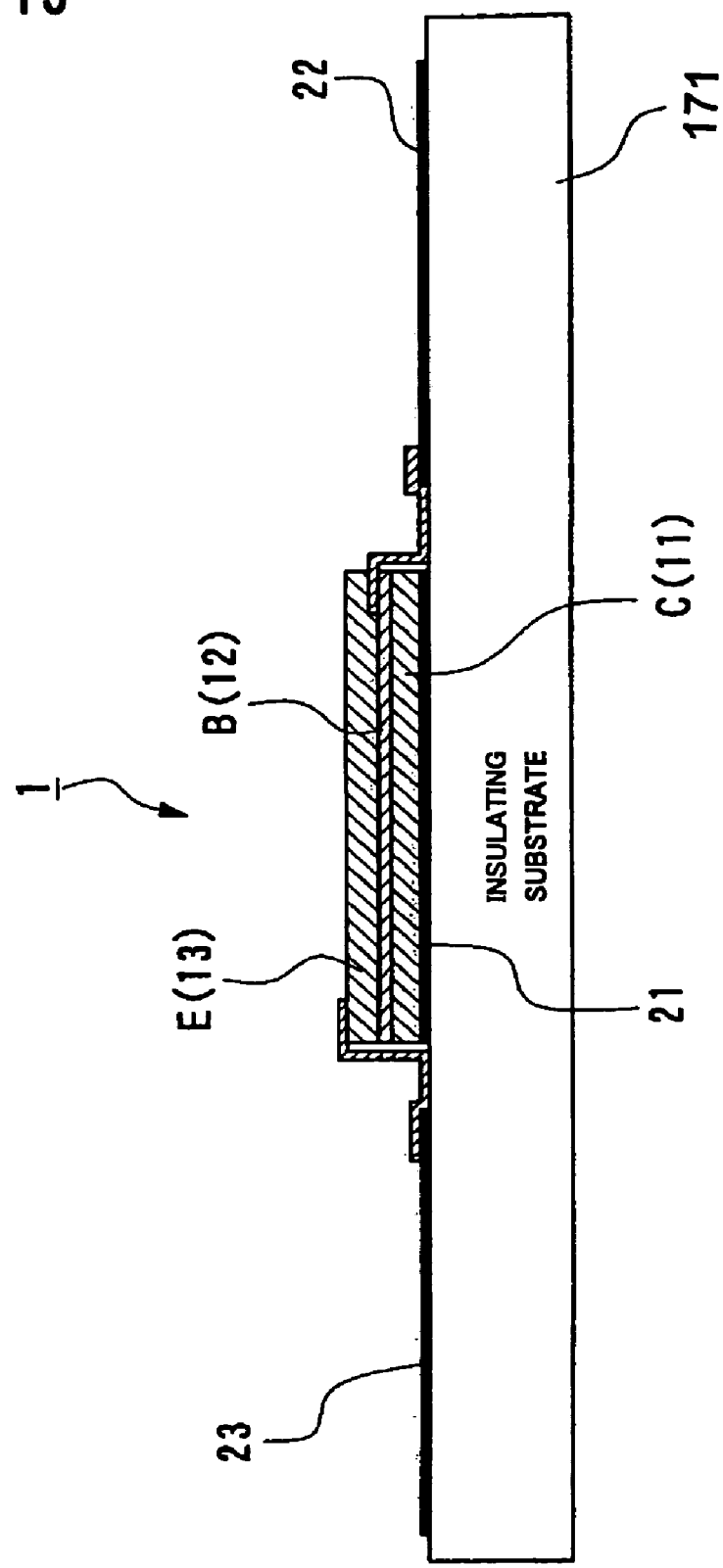
FIG. 15 is a schematic sectional view showing an eleventh step of the method for manufacturing a tile-shaped element.

FIG. 15 is a schematic sectional view showing an eleventh step of this method for manufacturing a semiconductor integrated circuit. Also, FIG. 15 shows a state in which the final substrate 171 is viewed from the view point B in FIG. 14. In this step, the base electrode B, and the emitter electrode E of the unit element 1 formed of the tile-shaped element 161 are respectively electrically connected to the common base wiring 22 and the common emitter wiring 23 on the insulating substrate 20, which is the final substrate 171, completing a semiconductor integrated circuit, such as one LSI chip. Examples of the final substrate 171 can include a ceramic, glass, quartz, glass epoxy, plastic, and compound semiconductor, as materials which are used for the insulating substrate 20 for a hetero-bipolar transistor, shown in FIG. 2. Examples which are used for the conductor substrate 20a and the insulating film 20b for the hetero-bipolar transistor, shown in FIG. 3, include an insulating film formed on a silicon substrate. Here, as the insulation film, an inorganic film of $SiO_2$, SiN, etc., or an organic film of polyimide, and the like, can be used.

As a result of the above, even if the insulating substrate 20, which is the final substrate 171, is, for example, plastic, a semiconductor element, which forms a hetero-bipolar transistor, can be formed on a substrate having a material different from that of the semiconductor element, that is, the unit element 1 which forms a hetero-bipolar transistor is formed at a desired position of the common collector wiring 21 of the insulating substrate 20.

Furthermore, since, after the unit element 1 is completed on the semiconductor substrate, it is cut off to a very small tile shape, it is possible to select the unit element 1 by testing the unit element 1 in advance before the integrated circuit, which forms a wireless circuit, etc., is produced.

According to the above-described manufacturing method, since handling is possible in such a manner that only the function layer including the semiconductor element (the unit element 1) can be cut off as a tile-shaped element from the semiconductor substrate and can be mounted in the film, the unit elements 1 can be selected individually and can be joined to the insulating substrate 20, and the size of the unit element 1 which can be handled can be decreased more than that of the conventional mounting technology. Therefore, a hetero-bipolar transistor having desired performance can be provided simply and easily and at a lower cost.

Furthermore, the hetero-bipolar transistor of this embodiment is suitable for a device which handles a high-frequency signal. Applications of the hetero-bipolar transistor of this embodiment include a power amplifier, a low-noise amplifier, and a pre-amplifier of an RF circuit in wireless communication. Therefore, the hetero-bipolar transistor of this embodiment may be used in a power amplifier, a pre-amplifier, etc. in electrical wired communication. Furthermore, the hetero-bipolar transistor of this embodiment may be used in a laser driver, a pre-amplifier, etc., in optical communication. Therefore, the hetero-bipolar transistor of this embodiment is suitable for components of a mobile phone, a wireless LAN device, and an optical communication module.

In the above-described manufacturing method, the tile-shaped element 161 (the unit element 1) is joined to the common collector wiring 21 by using the conductive bonding agent 173; alternatively, instead of the bonding agent, a solder can be used. Alternatively, joining is possible without the intervention of a bonding agent. For example, direct metal-metal joining may be performed by applying energy in a state in which the collector electrode C and the common collector wiring 21 are in direct contact with each other.

Alternatively, after a palladium film is formed on the surface of at least one of the collector electrode C and the common collector wiring 21 or preferably on both surfaces thereof, they may be directly joined together by causing them to be brought into contact with each other and by applying energy thereto. Since palladium is highly reactive, the energy required for joining can be reduced.

A description will now be given of another example of an electronic device including a semiconductor integrated circuit (hetero-bipolar transistor) of the above-described embodiment.

Figure 16:
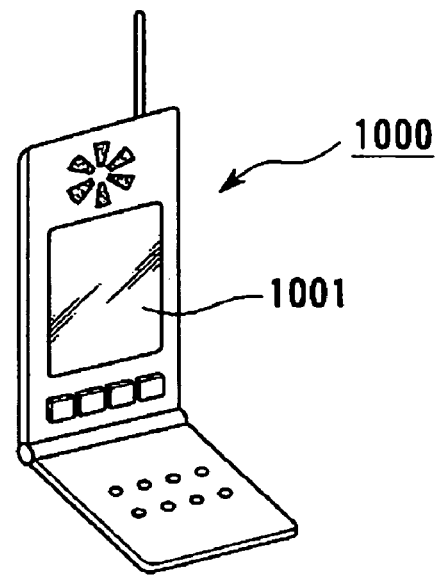
FIG. 16 shows an example of an electronic device including the circuit according to this embodiment.

FIG. 16 is a perspective view showing an example of a mobile phone. In FIG. 16, reference numeral 1000 denotes the main unit of the mobile phone including the hetero-bipolar transistor, and reference numeral 1001 denotes a display section.

Figure 17:
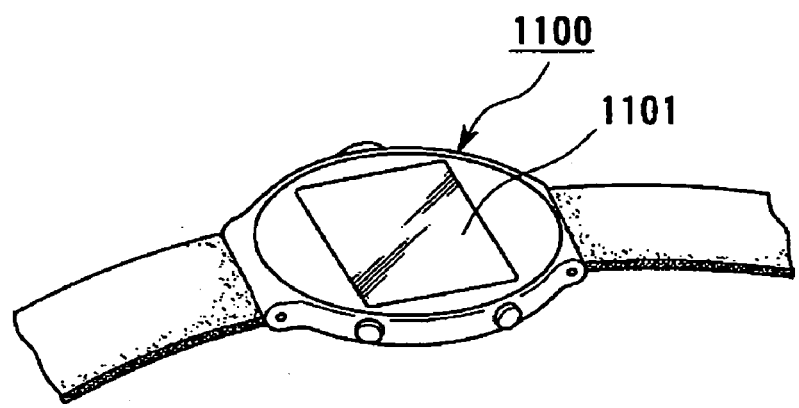
FIG. 17 shows an example of an electronic device including the circuit according to this embodiment.

FIG. 17 is a perspective view showing an example of a wrist watch type electronic device. In FIG. 17, reference numeral 1100 denotes the main unit of a watch using the hetero-bipolar transistor, and reference numeral 1101 denotes a display section.

Figure 18:
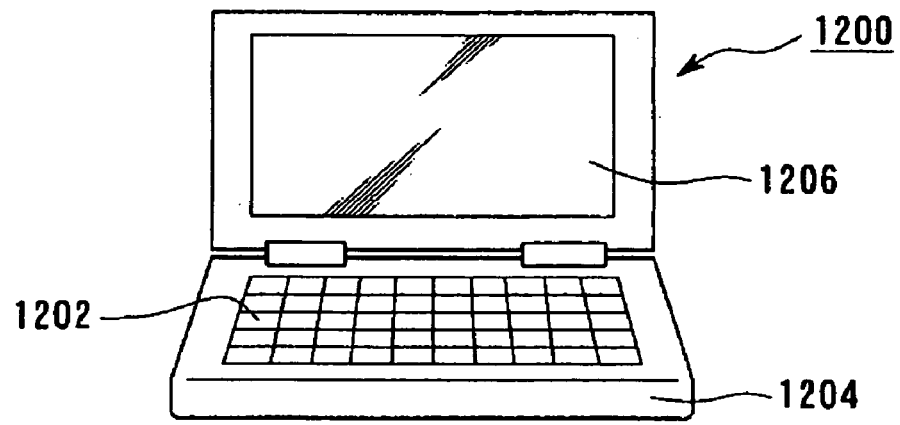
FIG. 18 shows an example of an electronic device including the circuit according to this embodiment.

FIG. 18 is a perspective view showing an example of a portable information processing device, such as a word processor or a personal computer. In FIG. 18, reference numeral 1200 denotes an information processing device. Reference numeral 1202 denotes an input section, such as a keyboard. Reference numeral 1204 denotes the main unit of the information processing device using the hetero-bipolar transistor. Reference numeral 1206 denotes a display section.

The electronic device shown in FIGS. 16 to 18 includes the hetero-bipolar transistor of the above-described embodiments. Therefore, a higher-speed, larger-output amplifier having good heat dissipation characteristics, high reliability, which can be manufactured easily, can be contained therein. Therefore, according to this embodiment, by forming a mobile phone, a wrist watch, a portable information processing device, etc., including a wireless device formed of the hetero-bipolar transistor, a higher-performance, inexpensive electronic device can be provided.

It should be understood that the technological scope of the present invention is not limited to the above-described embodiments. Various changes can be made without departing from the spirit and scope of the present invention. Specific materials and layer structures described in the embodiments are merely examples, and changes are possible as appropriate.

What is claimed is:

1. An amplification circuit, comprising:
   an insulating substrate;
   a first metal film disposed on the insulating substrate, the first metal film having a first surface and a second surface;
   a second metal film disposed on the insulating substrate;
   a third metal film disposed on the insulating substrate;
   a first layer which is arranged on the first metal film and which is made of an N-type semiconductor which is electrically coupled to the first metal film, the first layer having a third surface and a fourth surface;
   a second layer which is disposed on the first layer and which is made of a P-type semiconductor, the second layer having a fifth surface and a sixth surface; and
   a third layer which is disposed on the second layer and which is made of an N-type semiconductor, the third layer having a seventh surface and a eighth surface;
   the first surface being in contact with the insulating substrate,
   the third surface being in contact with the second surface,
   the fifth surface being in contact with the fourth surface,
   the seventh surface being in contact with the sixth surface,
   the second metal film being in contact with the sixth surface,
   the third metal film being in contact with the eighth surface.

2. The amplification circuit according to claim 1,
   the first layer functioning as a collector,
   the second layer functioning as a base, and
   the third layer functioning as an emitter.

3. The amplification circuit according to claim 1,
   the first metal film functioning as collector wiring,
   the second metal film functioning as base wiring, and
   the third metal film functioning as emitter wiring.

4. The amplification circuit according to claim 1,
   the second layer being formed on the entire top surface of the first layer, and
   the third layer being formed on a part of the area of the top surface of the second layer.

5. The amplification circuit according to claim 1,
   the first layer and the second layer being each formed in a rectangular plate shape, and
   the third layer being formed in a rectangular plate shape, a length of a short side of the third layer being shorter than that of the first layer and the second layer.

6. The amplification circuit according to claim 1, the first layer, the second layer, and the third layer being formed so as to cross on the top surface of the first metal film.

7. The amplification circuit according to claim 1, the first layer, the second layer, and the third layer being formed of layers that are formed as tile-shaped elements, which are very small tile-shaped semiconductor elements.

8. The amplification circuit according to claim 7, the tile-shaped elements being such that a collector electrode is formed on the bottom surface of the first layer, a base electrode is formed in an area other than the area where the third layer is provided on the top surface of the second layer, and an emitter electrode is formed on the top surface of the third layer, and
   the collector electrode in the tile-shaped elements is joined to the first metal film, the base electrode is joined to the second metal film, and the emitter electrode is joined to the third metal film.

9. The amplification circuit according to claim 1, the transistor being formed of a transistor that functions as a hetero-bipolar transistor.

10. The amplification circuit according to claim 9,
    the first layer being an N-type semiconductor made of gallium and arsenic,
    the second layer is a P-type semiconductor made of gallium and arsenic, and
    the third layer is an N-type semiconductor made of aluminum, gallium, and arsenic.

11. The amplification circuit according to claim 1,
    a plurality of the first layers being provided on the first metal film, and
    the second layer and the third layer being provided for each of the first layers.

12. The amplification circuit according to claim 11,
    a plurality of the second layers being interconnected with one another by the second metal film, and
    a plurality of the third layers being interconnected with one another by the third metal film.

13. The amplification circuit according to claim 1, the first metal film, the second metal film, and the third metal film do not intersect one another.

14. The amplification circuit according to claim 1,
the portion of the second metal film that is not connected to the second layer in the second metal film being directly provided on the insulating substrate, and
the portion of the third metal film that is not connected to the third layer in the third metal film being directly provided on the insulating substrate.

15. An electronic device, comprising an optical interconnection circuit having the amplification circuit according to claim 1.

16. An amplification circuit, comprising:
an insulating substrate;
a first metal film disposed on the insulating substrate;
a second metal film disposed on the insulating substrate;
a third metal film disposed on the insulating substrate; and
a plurality of transistors that overlaps the first metal film,
the plurality of transistors including first layers each of which is included in one transistor of the plurality of transistors, second layers each of which is disposed on one first layer of the plurality of first layers, third layers each of which is disposed on one second layer of the plurality of second layers,
the second metal film including a first part that extends along a first direction along which the first metal film extends and second parts each of which extend along a second direction intersecting the first direction,
the third metal film including a third part that extends along the first direction and fourth parts each of which extends along a third direction intersecting the first direction,
the first metal film being electrically connected to the first layers,
the second metal film being electrically connected to the second layers through the second parts,
the third metal film being electrically connected to the third layers through the fourth parts.

17. The amplification circuit according to claim 16,
the first metal layer being disposed between the first part and the third part.

18. The amplification circuit according to claim 16,
the first layers made of N-type semiconductors, the second layers made of P-type semiconductors and the third layers made of N-type semiconductors.

* * * * *